United States Patent
Ding et al.

(10) Patent No.: US 6,737,300 B2
(45) Date of Patent: May 18, 2004

(54) CHIP SCALE PACKAGE AND MANUFACTURING METHOD

(75) Inventors: Yi-Chuan Ding, Kaohsiung (TW); Xin Hui Lee, Kaohsiung (TW); Kun-Ching Chen, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 11 days.

(21) Appl. No.: 10/151,042

(22) Filed: May 21, 2002

(65) Prior Publication Data

US 2002/0142518 A1 Oct. 3, 2002

Related U.S. Application Data

(62) Division of application No. 09/767,904, filed on Jan. 24, 2001, now abandoned.

(51) Int. Cl.[7] .............................. H01L 21/48; H05K 3/34
(52) U.S. Cl. .................. 438/110; 438/112; 438/113; 438/114; 438/119; 438/127; 438/458; 438/462; 438/464; 29/840; 29/841; 29/843; 29/855
(58) Field of Search ............................. 438/22, 26, 33, 438/42, 48, 50, 51, 54, 55, 57, 68, 106–114, 118, 119, 125–127, 455, 458–460, 462, 464, 465, 584, 587, 597, 611–614, 617; 156/60; 29/729, 739–741, 829–832, 840–843, 854, 855; 228/179.1, 180.1, 180.21, 180.22, 180.5; 264/272.11, 272.14

(56) References Cited

U.S. PATENT DOCUMENTS

| | | | | | |
|---|---|---|---|---|---|
| 5,641,996 A | * | 6/1997 | Omoya et al. | ............... | 257/787 |
| 5,783,465 A | * | 7/1998 | Canning et al. | ............ | 438/119 |
| 5,918,113 A | * | 6/1999 | Higashi et al. | ............. | 438/119 |
| 6,049,038 A | * | 4/2000 | Suzuki | ................. | 174/52.2 |
| 6,204,564 B1 | * | 3/2001 | Miyata et al. | ............... | 257/778 |
| 6,256,207 B1 | * | 7/2001 | Horiuchi et al. | ............ | 361/760 |
| 6,311,888 B1 | * | 11/2001 | Funada et al. | .............. | 228/106 |
| 6,335,568 B1 | * | 1/2002 | Yuzawa et al. | ............. | 257/738 |
| 6,346,750 B1 | * | 2/2002 | Jiang et al. | .................. | 257/783 |
| 6,355,504 B1 | * | 3/2002 | Jiang | ......................... | 438/118 |
| 6,414,397 B1 | * | 7/2002 | Sawamoto | ................... | 257/783 |
| 6,426,566 B1 | * | 7/2002 | Sawamoto | ................... | 257/783 |
| 6,461,890 B1 | * | 10/2002 | Shibata | ........................ | 438/106 |
| 6,492,738 B2 | * | 12/2002 | Akram et al. | ............... | 257/783 |
| 6,514,796 B2 | * | 2/2003 | Usami et al. | ............... | 438/118 |
| 6,562,637 B1 | * | 5/2003 | Akram et al. | ................. | 437/14 |

FOREIGN PATENT DOCUMENTS

| | | | | | |
|---|---|---|---|---|---|
| JP | 60225439 A | * | 11/1985 | ........... | H01L/21/60 |
| JP | 04030542 A | * | 2/1992 | ........... | H01L/21/60 |

\* cited by examiner

*Primary Examiner*—Alonzo Chambliss
(74) *Attorney, Agent, or Firm*—Dykema Gossett PLLC

(57) ABSTRACT

A chip scale package mainly comprises a substrate attached to the active surface of a semiconductor chip through an anisotropic conductive adhesive film (ACF). The substrate is provided with a plurality of contact pads on the lower surface thereof and a plurality of solder pads on the upper surface thereof wherein the contact pads are electrically coupled to corresponding solder pads. A plurality of metal bumps provided on the contact pads of the substrate. The metal bumps on the substrate are electrically coupled to corresponding bonding pads on the chip through the ACF. The side portions of the substrate and the ACF are sealed in a package body. The present invention further provides a method of making the chip scale package at the wafer level. The method is characterized by attaching substrates onto the chips of a wafer one by one so as to greatly reduce the problems associated with CTE mismatch between the wafer and the substrate thereby significantly enhancing the product yield.

22 Claims, 5 Drawing Sheets

CHIP SCALE PACKAGE AND MANUFACTURING METHOD

CROSS-REFERENCE TO RELATED APPLICATION

This application is a division of application Ser. No. 09/767,904, filed Jan. 24, 2001 now abandoned.

BACKGROUND OF THE INVENTION

1. Field of the Invention

This invention relates to a chip scale package (CSP), and more specifically to a method of making the chip scale package at the wafer level.

2. Description of the Related Art

As electronic devices have become more smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and thin small outline package (TSOP). Typically, a CSP is 20 percent larger than the chip itself. The most obvious advantage of CSP is the size of the package; that is, the package is slightly larger than the chip. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thermal path.

However, CSP has at least one disadvantage compared to conventional BGA and TSOP, namely, high cost per unit. However, this problem could be eliminated if chip-sized packages could be mass produced more easily. Therefore, there is a need in the semiconductor packaging industry for CSP using mass production techniques at the wafer-level, as is illustrated in U.S. Pat. Nos. 5,977,624 and 6,004,867. Usually, methods of making wafer-level CSPs mainly comprise a step of attaching a substrate directly onto a wafer that is used prior to being diced into individual chips. The substrate includes a plurality of units corresponding to the chips on the wafer, and the dimensions thereof are substantially the same as the wafer.

Normally, the wafer is formed of microcrystalline silicon with a coefficient of thermal expansion (CTE) of 3–5 ppm/° C. and the substrate is usually formed of polymer having a coefficient of thermal expansion of 20–30 ppm/° C. Since there is a significant difference between the wafer and the substrate in CTE, the wafer and the substrate expand and contract in different amounts along with temperature fluctuations. This imposes both shear and bend stresses on the interface between the wafer and the substrate. Since the dimensions of the substrate are substantially the same as the wafer, the destructive stresses will accumulate. This greatly magnifies the reliability problems associated therewith.

Typically, the chips on the wafer go through a test to determine whether the chips are defective or not. After completing the testing process, at least some chips will be evaluated as defective. Therefore, in the conventional techniques described above, the substrate units attached on the defective chips are wasted. Similarly, it is very difficult to provide 100% good units on the substrate. Therefore, in the conventional techniques described above, the chips corresponding to defective units are also wasted.

Consequently, there is a need for a method of manufacturing chip scale packages at the wafer-level which reduces the problems and disadvantages associated with the above-described technique.

SUMMARY OF THE INVENTION

It is therefore an object of the present invention to overcome, or at least reduces the problems and disadvantages associated with the above-described technique for fabricating chip scale packages at the wafer-level It is another objective of the present invention to provide a method for fabricating chip scale packages at the wafer-level in which the packaging yield is significantly enhanced.

The chip scale package in accordance with the present invention mainly comprises a substrate attached to the active surface of a semiconductor chip through an anisotropic conductive adhesive film (ACF). The substrate is provided with a plurality of contact pads on the lower surface thereof and a plurality of solder pads on the upper surface thereof wherein the contact pads are electrically coupled to corresponding solder pads. A plurality of metal bumps are provided on the contact pads of the substrate. The semiconductor chip has a plurality of bonding pads formed on the active surface thereof. The metal bumps on the substrate are electrically coupled to corresponding bonding pads on the chip through the ACF. The side portions of the substrate and the ACF are sealed in a package body.

According to the present invention, the method for manufacturing chip scale packages at the wafer-level comprises steps of: (a) providing a substrate strip including a plurality of substrates; (b) forming a plurality of metal bumps on the contact pads provided on the lower surface of each substrate; (c) attaching an anisotropic conductive adhesive film (ACF) onto the lower surface of the substrate strip to form a ACF/strip assembly; (d) cutting the ACF/strip assembly into individual substrates having ACF formed on the lower surface thereof; (e) attaching the substrates onto the chips of a wafer through the ACF formed on each substrate such that the metal bumps on each substrate are electrically coupled to corresponding bonding pads on each chip; (f) forming grooves corresponding to boundary regions between the chips; (g) sealing the grooves; and (h) cutting along the sealing grooves so as to obtain individual chip scale packages.

According to the present invention, the CSP manufacturing method is characterized in that each of the substrates is attached onto the chips of the wafer one by one. This greatly reduces the problems associated with CTE mismatch between the wafer and the substrate thereby significantly enhancing the product yield. Furthermore, we could attach only accepted substrates onto the wafer so as to avoid wasting good chips of the wafer.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 14:
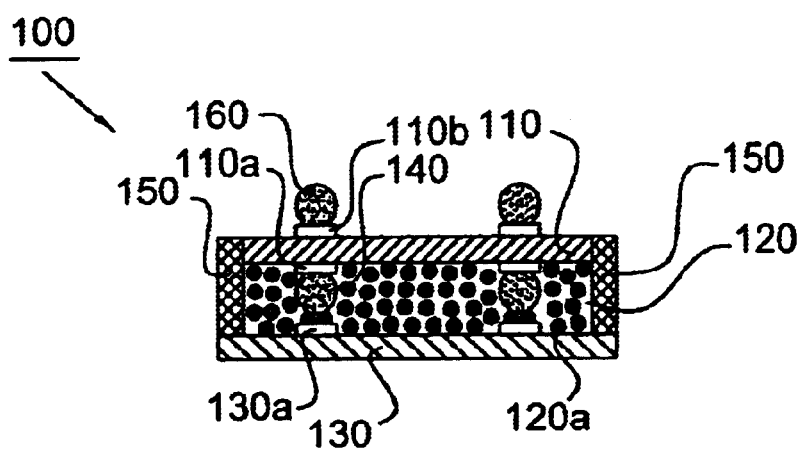
FIG. 14 is a cross sectional view of a chip scale package according to a preferred embodiment of the present invention.

FIG. 14 Shows a chip scale package 100 in accordance with a preferred embodiment of the present invention. The CSP 100 mainly comprises a substrate attached to the active surface of a semiconductor chip 130 through an anisotropic conductive adhesive film (ACF) 120. The lower surface of the substrate 110 is provided with a plurality of contact pads 110a. A plurality of metal bumps 140 are formed on the contact pads 110a. Preferably, the metal bumps 140 are stud bumps formed from conventional wire bonding techniques. The semiconductor chip 130 has a plurality of bonding pads 130a formed on the active surface thereof. The metal bumps 140 on the substrate are electrically coupled to corresponding bonding pads 130a through the ACF 120. The side portions of the substrate 110 and the ACF are sealed in a package body 140. One type of anisotropic adhesive suitable for forming the ACF 120 is known as a "z-axis znisotropic adhesive". Z-axis anisotropic adhesives are filled with conductive particles 120a to a low level such that the particles do not contact each other in the xy plane. Therefore, compression of the material in the z direction establishes an electrical path.

According to the present invention, the upper surface of the substrate 110 is provided with a plurality of solder pads 110b adapted for mounting solder balls 160. The contact pads 110a on the lower surface of the substrate 110 are electrically coupled to corresponding solder pads through conductive lines (not shown) formed in the substrate. The substrate use with the invention can include any number of layers of conductor circuits if desired. Preferably, the substrate is a BGA substrate formed by any of a number of build-lip technologies. The substrate may be formed from a core layer made of fiberglass reinforced BT (bismaleimide-triazine) resin or FR-4 fiberglass reinforced epoxy resin. Alternatively, the substrate may be a multi-layer ceramic substrate or a polyimide film substrate.

FIGS. 1–13 illustrate a method for manufacturing chip scale packages at the wafer-level according to a preferred embodiment of the present invention.

Figure 1:
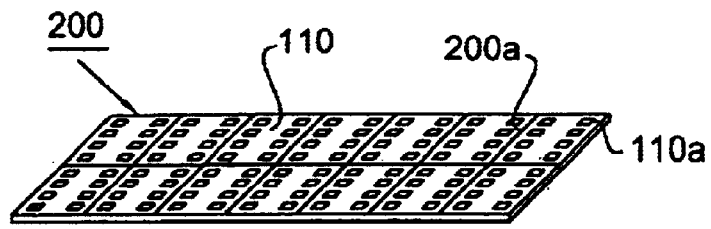
FIGS. 1–13 illustrate a method for manufacturing chip scale packages according to a preferred embodiment of the present invention.

Referring to FIG. 1, in mass production, it is desirable to integrally form a plurality of substrates 110 in a strip (typically referred to as a "substrate strip 200") preferably having street lines 200a between the substrates for dicing.

Figure 2:
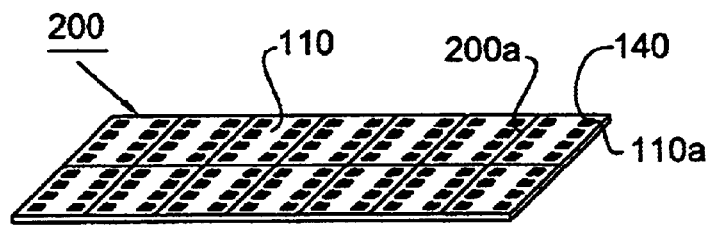
Figure 3:
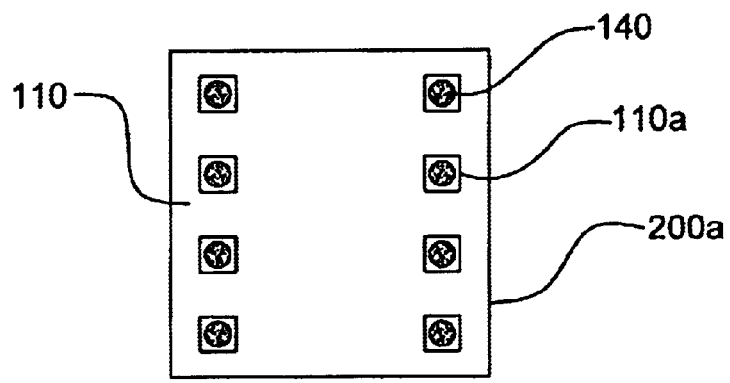
Figure 4:
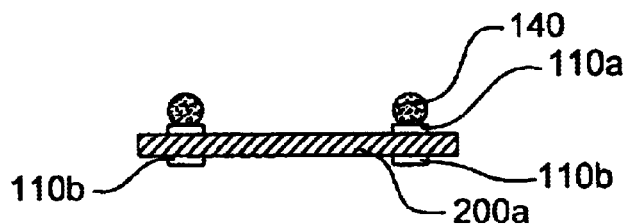

FIG. 2 shows a plurality of metal bumps 140 formed on the substrate strip 200. The metal bumps 140 are disposed on the contact pads 110a of each substrate 110. Preferably, the metal bumps 140 are stud bumps formed from conventional wire bonding techniques. Alternatively, the metal bumps 140 may be formed by a conventional bumping technology comprising the steps of: (a) forming an under bump metallurgy (UBM) on the contact pads of each substrate by, e.g., electroless nickel/gold plating, and (b) forming metal bumps on the UBM by, e.g., vapor deposition, electroplating or printing.

Figure 5:
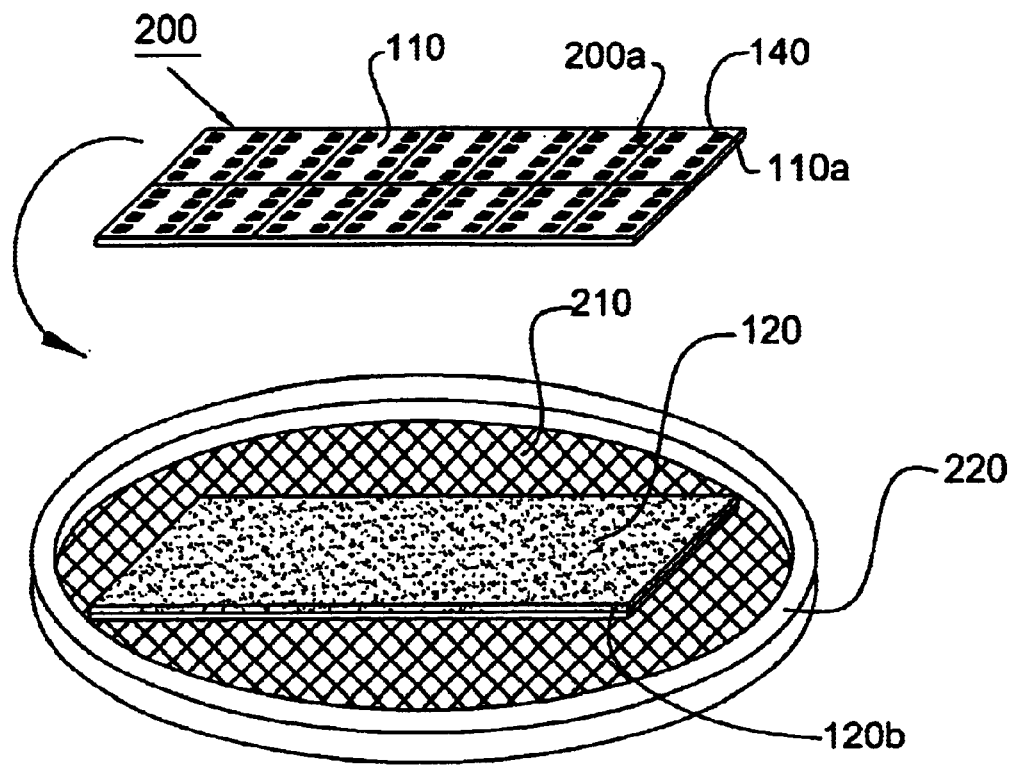

FIG. 5 shows an anisotropic conductive adhesive film (ACF) 120 with a release film on the lower surface of the ACF attached on an adhesive sheet 210. Usually, the anisotropic conductive adhesive film 120b is shipped in the form of having release films protecting the upper and lower surfaces thereof. Firstly, the ACF with the release films thereon is attached onto the adhesive 210 with the release film 120b on lower surface thereof facing the adhesive sheet. Then, the release film on the upper surface of the ACF is removed. Preferably, the adhesive sheet is a blue tape supported by a ring frame adapted to be used in wafer dicing.

Figure 6:
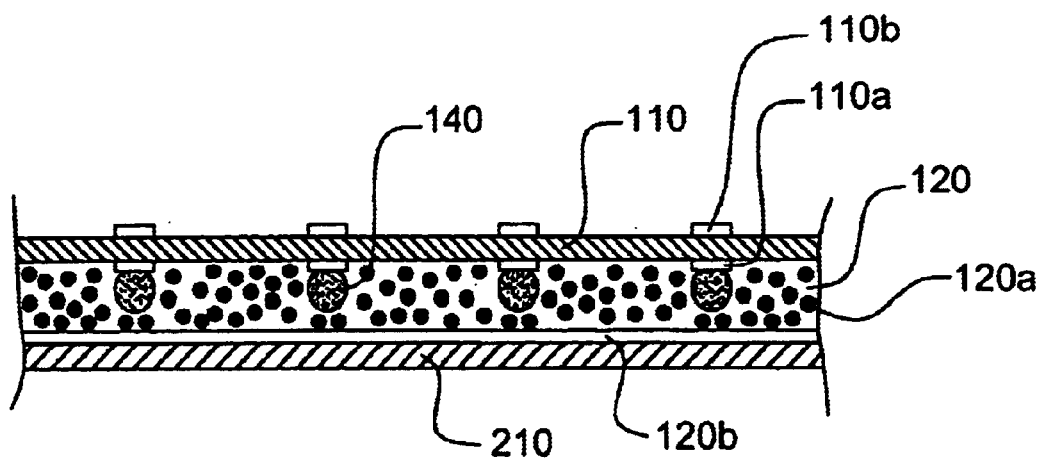
Figure 7:
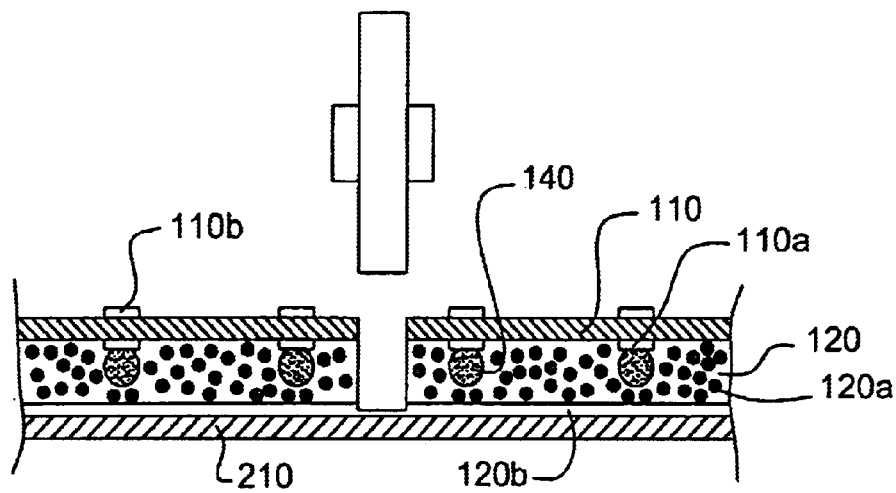

Referring to FIG. 5 and FIG. 6, the substrate strip 200 with metal bumps formed on the lower surface thereof is attached onto the ACF 120 to form an ACF/strip assembly (see FIG. 6).

Figure 8:
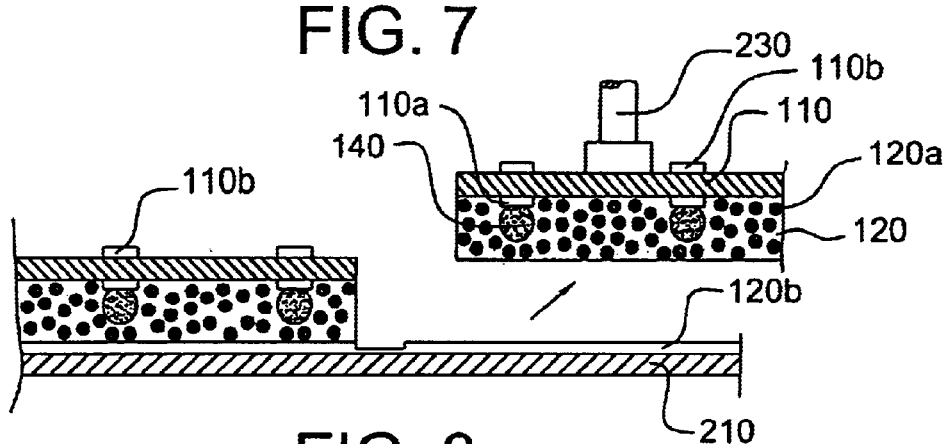
Figure 9:
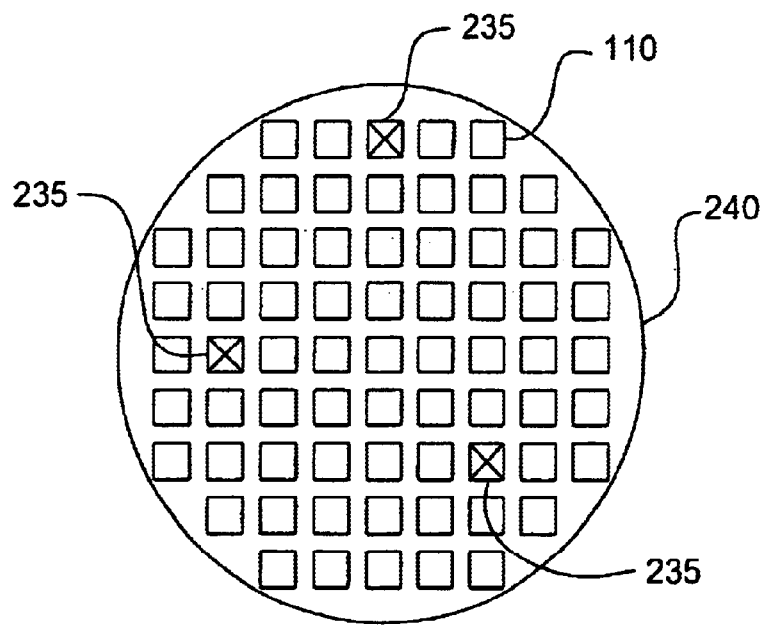

Referring to FIG. 8, an automatic pick and place machine 230 picks one substrate 110 as well as ACF 120 thereon and accurately places it to on the predetermined area of the wafer 240 (see FIG. 9). Usually, defective substrates of the substrate strip 200 are marked with white ink so that the defective substrates can be distinguished from other normal substrates. Therefore, the pick and place machine 230 can sort the normal substrates by recognizing the bad-substrate marks. Then, we may decide that only accepted substrates are attached onto the wafer so as to avoid wasting good chips of the wafer. Furthermore, defective chips of the wafer may also be attached with dummy substrates 235 (see FIG. 9) via common adhesives such as epoxy so as to avoid wasting good substrates and ACF thereon. It is noted that the dummy substrate has the same material as the substrate described above. However, wiring is not required for the dummy substrates thereby reducing cost.

Figure 10:
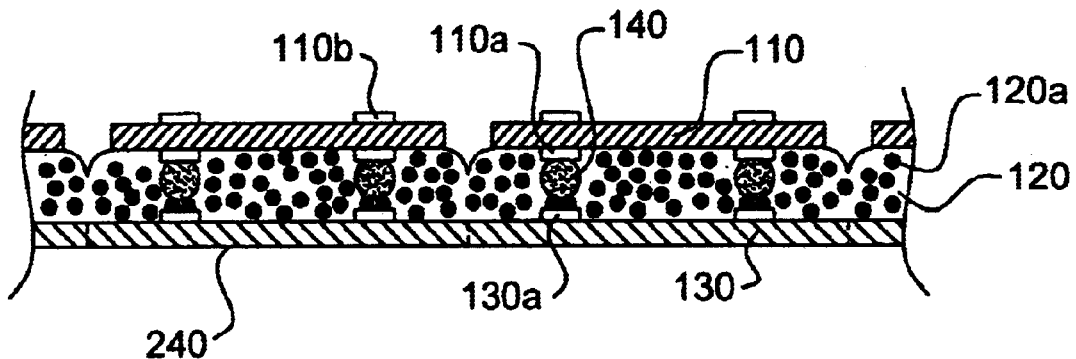

Then, after Conducting a thermocompression bonding, the substrate 110 is adhered to the chips 130 of the wafer 240 through the ACF 120 on the substrate, and the metal bumps 140 on each substrate 110 are electrically coupled to corresponding bonding pads 130a on the chip 130 (see FIG. 10). It should be understood that the ACF may be thermosetting or thermoplastic. Thermal plastic anisotropic adhesives are heated to soften for use and then cooled for curing. Thermal setting anisotropic adhesives require heat curing at temperatures from 100° C.–300° C. for from several minutes to an hour or more.

According to one embodiment of the present invention, a dicing blade may be used to cut the assembly of FIG. 10 into individual chip scale packages after a plurality of solder balls 160 are mounted on the solder pads 110b of the substrate 110.

According to one embodiment of the present invention, a dicing blade may be used to cut the assembly of FIG. 10 into individual chip scale packages after a plurality of solder balls 160 are mounted on the solder pads 140 of the substrate 110.

Figure 11:
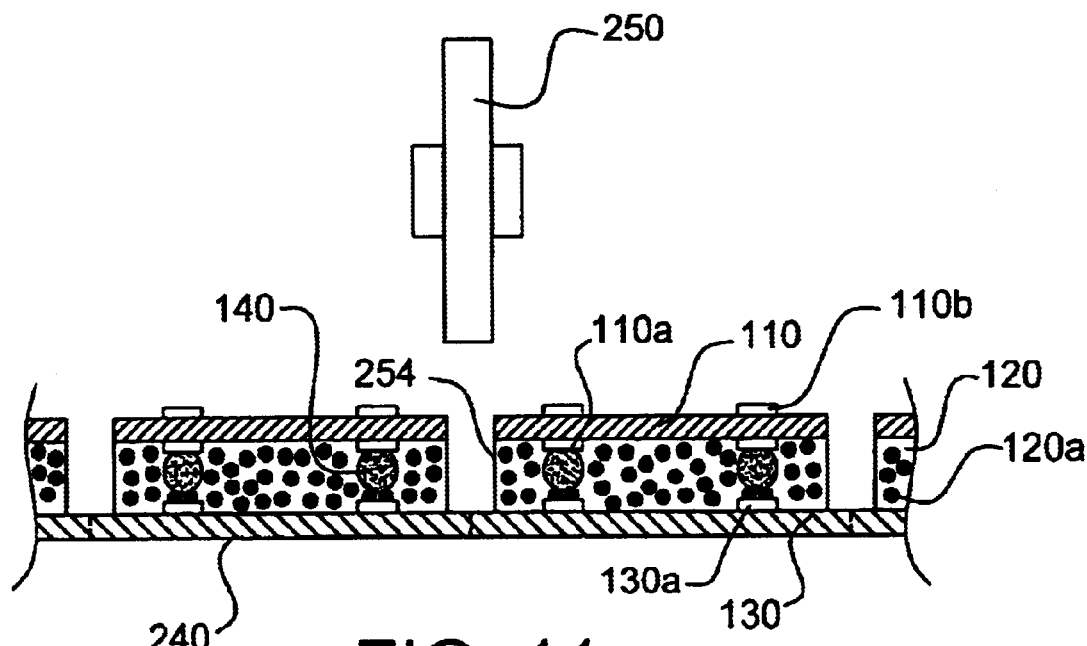

Referring to FIG. 11, grooves 254 are formed corresponding to the boundary regions between chips 130 by a dicing blade 250. It is noted that the grooves 254 are defined deeper than the thickness of the substrate 110 and ACF 120, but are not deeper than the thickness of the substrate 110, ACF 120 and wafer 240. Preferably, the grooves 254 have a depth substantially equal to the thickness of the substrate 110 and ACF 120.

Figure 12:
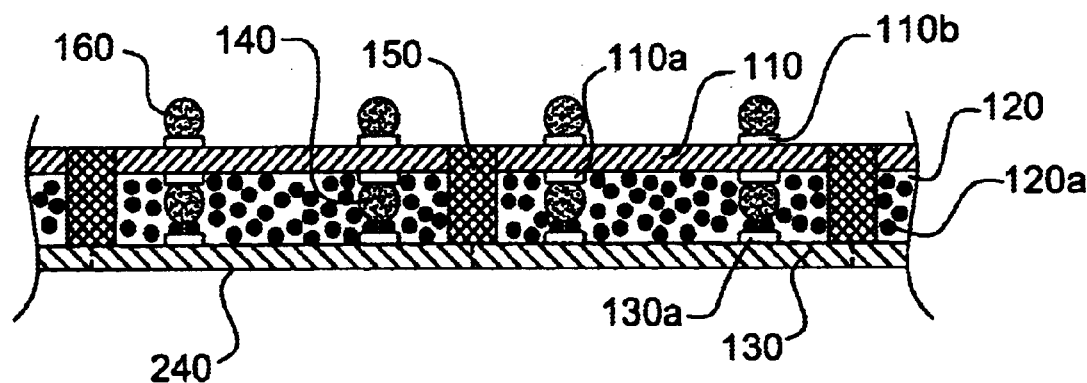

Referring to FIG. 12, underfill material is laid down along the grooves 254 by using an automated underfill dispense system. Then, the assembly of FIG. 12 is placed into an underfill curing oven, and then the underfill is cured to form a package body 150.

Preferably the CSP manufacturing method of the present invention further comprises a step of mounting a plurality of solder balls (not shown) on the solder pads 110b of the substrate The mounting step is preferably performed after curing the underfill. The solder balls may be formed on the solder pads 110b of the substrate by solder ball placing technique or stencil printing process. The solder balls act as external I/O electrodes of the chip scale package in accordance with the present invention.

Figure 13:
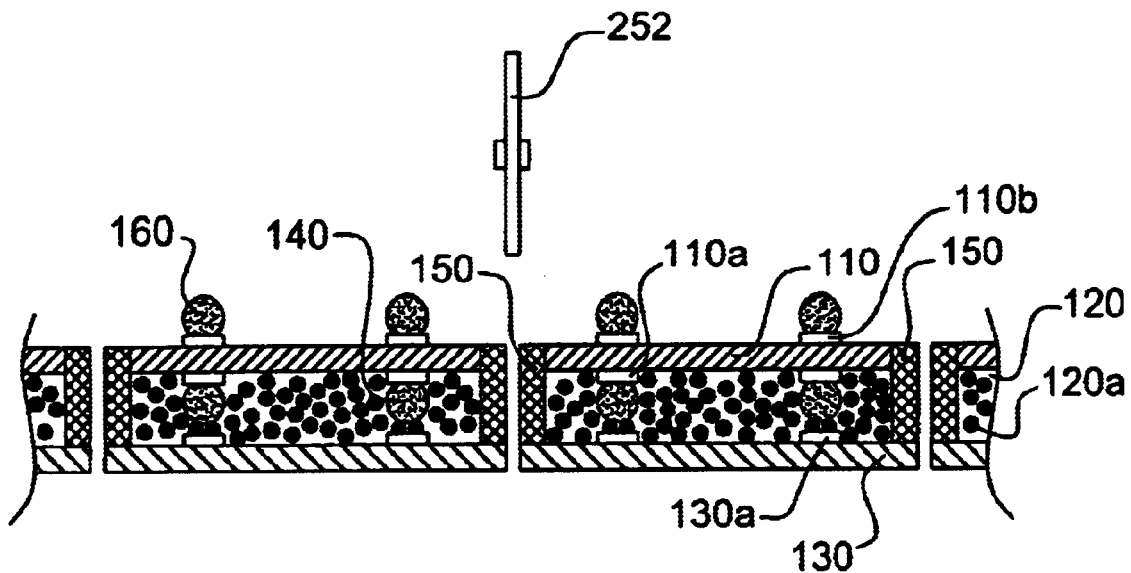

Finally, referring to FIG. 13, another dicing blade 252 cuts the sealed groove and the wafer into individual chip scale packages 100 (see FIG. 14). It is noted that the dicing blade 252 is thinner than the dicing blade 250 used to form the grooves 254 such that the side portions of the ACF 120 is sealed by the package body 150 for protecting the package 100 against moisture and/or contamination from outside.

According to the present invention, the CSP manufacturing method is characterized in that each of the substrates is attached onto the chips of the wafer one by one. This greatly reduces the problems associated with CTE mismatch between the wafer and the substrate thereby significantly enhancing the product yield.

Although the invention has been explained in relation to its preferred embodiment, it is to be understood that many other possible modifications and variations can be made without departing from the spirit and scope of the invention as hereinafter claimed.

What is claimed is:

1. A method for manufacturing chip scale packages at the wafer-level, comprising steps of:
   providing a substrate strip including a plurality of substrates, each substrate having opposing upper and lower surfaces, a plurality of contact pads on the lower surface of each substrate and a plurality of solder pads on the upper surface of each substrate wherein the contact pads are electrically coupled to corresponding solder pads;
   forming a plurality of metal bumps on the contact pads of each substrate;
   attaching an anisotropic conductive adhesive film (ACF) onto the lower surface of the substrate strip to form an ACF/strip assembly;
   cutting the ACF/strip assembly into individual substrates having the ACF formed on the lower surface thereof;
   providing a wafer including a plurality of semiconductor chips wherein each chip has a plurality of bonding pads on the active surface thereof;
   attaching the substrates onto the chips of the wafer through the ACF formed on each substrate such that the metal bumps on each substrate are electrically coupled to corresponding bonding pads on the chip;
   forming grooves corresponding to boundary regions between the semiconductor chips;
   sealing the grooves with an underfill material; and
   cutting along the sealing grooves so as to obtain individual chip scale packages.

2. The method as claimed in claim 1, wherein the grooves are defined deeper than the thickness of the substrate and the ACF, but are not deeper than the thickness of the substrate, the ACF and the wafer.

3. The method as claimed in claim 1, wherein the grooves have a depth substantially equal to the thickness of the substrate and the ACF.

4. The method as claimed in claim 1, wherein the step of forming the grooves includes using a first blade and the step of cutting the wafer and the sealing grooves includes using a second blade having a thickness thinner than the first blade.

5. The method as claimed in claim 1, wherein the substrate is a BGA (ball grid array) substrate.

6. The method as claimed in claim 1, further comprising the step of mounting a plurality of solder balls on the solder pads of the substrate.

7. The method as claimed in claim 1, wherein the metal bumps are stud bumps formed from conventional wire bonding techniques.

8. A method for manufacturing chip scale packages at the wafer-level, comprising steps of;
   providing a substrate strip including a plurality of substrates, each substrate having opposing upper and lower surfaces, a plurality of contact pads on the lower surface of each substrate and a plurality of solder pads on the upper surface of each substrate wherein the contact pads are electrically coupled to corresponding solder pads;
   forming a plurality of metal bumps on the contact pads of each substrate;
   providing an anisotropic conductive adhesive film (ACF) with both upper and lower surfaces protected by a release film;
   attaching the ACF to an adhesive sheet with the release film on the lower surface thereof facing the adhesive sheet and then removing the release film from the upper surface of the ACF;
   attaching the substrate strip to the ACF with the metal bumps on the lower surface of the substrate strip facing the ACF to form an ACF/strip assembly;
   cutting the ACF/strip assembly into individual substrates having the ACF formed on the lower surface thereof;
   providing a wafer including a plurality of semiconductor chips wherein each chip has a plurality of bonding pads on the active surface thereof;
   separating the substrates from the adhesive sheet so as to leave the lower release film on the adhesive sheet and attaching the substrates onto the chips of the wafer through the ACF formed on each substrate such that the metal bumps on each substrate are electrically coupled to corresponding bonding pads on the chip;
   forming grooves corresponding to the boundary regions between the semiconductor chips;
   sealing the grooves with an underfill material; and
   cutting along the sealing grooves so as to obtain individual chip scale packages.

9. The method as claimed in claim 8, wherein the grooves are defined deeper than the thickness of the substrate and the ACF, but are not deeper than the thickness of the substrate, the ACF and the wafer.

10. The method as claimed in claim 8, wherein the grooves have a depth substantially equal to the thickness of the substrate and the ACF.

11. The method as claimed in claim 2, wherein the forming of the grooves includes using a first blade and the cutting of the wafer and the sealing grooves includes using a second blade, the second blade being thinner than the first blade.

12. The method as claimed in claim 8, wherein the substrate is a BGA (ball grid array) substrate.

13. The method as claimed in claim 8, further comprising the step of mounting a plurality of solder balls on the solder pads of the substrate.

14. The method as claimed in claim 13, wherein the solder balls mounting step is performed after sealing the grooves and before cutting along the sealing grooves.

15. The method as claimed in claim 8, wherein the metal bumps formed the conventional wire bonding techniques.

16. The method as claimed in claim 8, wherein the adhesive sheet is a blue tape used in wafer dieing.

17. A method for manufacturing chip scale packages at the wafer-level, comprising steps of;
   providing a substrate strip including a plurality of substrates, each substrate having opposing upper and lower surfaces, a plurality of contact pads on the lower surface of each substrate and a plurality of solder pads on the upper surface of each substrate wherein the contact pads are electrically coupled to corresponding solder pads;

forming a plurality of metal bumps on the contact pads of each substrate;

attaching an anisotropic conductive adhesive film (ACF) onto the lower surface of the substrate strip to form an ACF/strip assembly;

cutting the ACF/strip assembly into individual substrates having the ACF formed on the lower surface thereof;

providing a wafer including a plurality of semiconductor chips wherein each chip has a plurality of bonding pads on the active surface thereof;

attaching the substrates onto the chips of the wafer through the ACF formed on each substrate such that the metal bumps on each substrate are electrically coupled to corresponding bonding pads on the chip; and cutting the wafer with the substrates attached thereon so as to obtain individual chip scale packages.

18. The method as claimed in claim 17, further comprising the step of mounting a plurality of solder balls on the solder pads of the substrate.

19. The method as claimed in claim 17, wherein the metal bumps are stud bumps formed from conventional wire bonding techniques.

20. A method for manufacturing chip scale packages at the wafer-level, comprising steps of:

providing a substrate strip including a plurality of substrates, each substrate having opposing upper and lower surfaces, a plurality of contact pads on the lower surface of each substrate and a plurality of solder pads on the upper surface of each substrate wherein the contact pads are electrically coupled to corresponding solder pads;

forming a plurality of metal bumps on the contact pads of each substrate;

providing an anisotropic conductive adhesive film (ACF) with both upper and lower surfaces protected by a release film;

attaching the ACF to an adhesive sheet with the release film on the lower surface thereof facing the adhesive sheet and then removing the release film from the upper surface of the ACF;

attaching the substrate strip to the ACF with the metal bumps on the lower surface of the substrate strip facing the ACF to form an ACF/strip assembly;

cutting the ACE/strip assembly into individual substrates having the ACF formed on the lower surface thereof;

providing a wafer including a plurality of semiconductor chips wherein each chip has a plurality of bonding pads on the active surface thereof;

separating the substrates from the adhesive sheet to so as to leave the lower release film on the adhesive sheet and attaching the substrates onto the chips of the wafer through the ACF formed on each substrate such that the metal bumps on each substrate are electrically coupled to corresponding bonding pads on the chip; and cutting the wafer with the substrates attached thereon so as to obtain individual chip scale packages.

21. The method as claimed in claim 20, further comprising the step of mounting a plurality of solder bails on the solder pads of the substrate.

22. The method as claimed in claim 20, wherein the metal bumps are stud bumps formed from conventional wire bonding techniques.

* * * * *